United States Patent
Rho

(10) Patent No.: US 8,400,824 B2
(45) Date of Patent: Mar. 19, 2013

(54) NON-VOLATILE MEMORY DEVICE AND METHOD FOR CONTROLLING THE SAME

(75) Inventor: Kwang Myoung Rho, Yongin (KR)

(73) Assignee: Hynix Semiconductor Inc., Icheon (KR)

( * ) Notice: Subject to any disclaimer, the term of this patent is extended or adjusted under 35 U.S.C. 154(b) by 174 days.

(21) Appl. No.: 12/980,252

(22) Filed: Dec. 28, 2010

(65) Prior Publication Data

US 2012/0147664 A1 Jun. 14, 2012

(30) Foreign Application Priority Data

Dec. 8, 2010 (KR) .................. 10-2010-0124843

(51) Int. Cl.
*G11C 11/00* (2006.01)
(52) U.S. Cl. ............... 365/158; 365/196; 365/185.13; 365/230.01; 365/210.1; 365/148
(58) Field of Classification Search .......... 365/158, 365/196, 207, 185.13, 230.01, 148
See application file for complete search history.

(56) References Cited

U.S. PATENT DOCUMENTS

| 2004/0047216 A1 | 3/2004 | Ishikawa et al. |
| 2007/0247940 A1* | 10/2007 | Liaw et al. ............ 365/208 |

FOREIGN PATENT DOCUMENTS

| JP | 2004-103060 A | 4/2004 |
| KR | 1020100119426 A | 11/2010 |

\* cited by examiner

*Primary Examiner* — Thong Q Le

(57) ABSTRACT

A non-volatile memory and method for controlling the same prevents a faulty operation from being generated in a read operation, resulting in increase in operation reliability. The non-volatile memory device includes a cell array configured to include a plurality of unit cells in which a read or write operation of data is achieved in a unit cell in response to a variation of resistance, a reference cell array configured to include a plurality of reference cells, each of which has the same structure as that of the unit cell, a global reference current generation circuit configured to generate a global reference current corresponding to a position of the reference cell so as to verify data stored in the reference cell array, and a sense-amplifier configured to compare a current flowing in the reference cell array with the global reference current during a write verification operation of the reference cell array, and thus sense data.

26 Claims, 8 Drawing Sheets

NON-VOLATILE MEMORY DEVICE AND METHOD FOR CONTROLLING THE SAME

CROSS-REFERENCE TO RELATED APPLICATION

The priority of Korean patent application No. 10-2010-0124843 filed on Dec. 8, 2010, the disclosure of which is hereby incorporated in its entirety by reference, is claimed.

BACKGROUND OF THE INVENTION

Embodiments of the present invention relate to a non-volatile memory device and method for controlling the same, and more specifically, to a technology for increasing the operation reliability of a non-volatile memory device in such a manner that the sensing and transmitting of data can be stably achieved during a read operation in which data stored in a unit cell is output externally.

Semiconductor memory devices have been rapidly developed to temporarily or permanently store data therein. The semiconductor memory devices have been widely used in a variety of electronic appliances, electronic devices, and personal portable devices. General semiconductor memory devices can freely read and/or write data, and can also easily update old data with new data.

The semiconductor memory device has been increasingly developed such that it can store much more data therein, can be operated with a smaller amount of power, and can have an increased or expedited operating speed. Although a NOR flash memory device or a NAND flash memory device has been widely used as non-volatile memory, a conventional flash memory device has a disadvantage in that it has a slow operating speed. In order to overcome the above-mentioned disadvantage, a non-volatile solid status memory device, generally called a magnetic random access memory (RAM) device or a magnetic memory device, has been recently proposed and developed.

A non-volatile memory device formed of a magnetic material has not only characteristics of a dynamic RAM (DRAM) device which has a high data processing speed, a high integration degree, and low power consumption, but also characteristics of a flash memory device capable of preserving data even when not powered. Unlike a DRAM device for storing information according to an electrical charging scheme, the non-volatile memory device formed of the magnetic material stores information or data using a magneto resistive effect, and may be implemented with a Giant Magneto Resistive (GMR) element or a Tunneling Magneto Resistance (TMR) element.

FIG. 1 is a circuit diagram illustrating a read operation of a general non-volatile memory device.

Referring to FIG. 1, the general non-volatile memory device includes a unit cell 110, a bit line 120, a source line 130, a sense-amplifier (also called a sense-amp) 140, a first switching unit 150, a second switching unit 160, a third switching unit 170, and a fourth switching unit 180.

In this case, the unit cell 100 includes a Magnetic Tunneling Junction (MTJ) element 112 and a cell transistor 114. The MTJ element 112 has a resistive MTJ (RMTJ) value, and the cell transistor 114 is controlled by a voltage of a word line WL.

The bit line 120 is coupled to the MTJ element 112, such that it has a bit line resistance (RBL) value. The source line 130 is coupled between one end of the cell transistor 114 and the second switching unit 160, such that it has a source line resistance (RSL) value.

The sense-amp 140 includes a current source IREF, a switching element, and an amplifier, such that it senses and amplifies data stored in the unit cell 110. In this case, the current source IREF generates a bit line current IBIT in response to a core voltage VCORE. The amplifier compares a voltage generated by the current source IREF with a reference voltage VREF, such that it outputs an output voltage VOUT. The switching element is controlled by a voltage suppression signal (also called a voltage clamping control signal) VCMP, such that it restricts a level of a bit line current IBIT generated by the current source IREF.

Generally, a memory is configured in the form of an array which is composed of a plurality of cells. Therefore, on a current path to obtain data stored in the specific unit cell 110, there are parasitic resistances of common signal lines 120 and 130 and the first switching unit 150, the second switching unit 160, the third switching unit 170, and the fourth switching unit 180 for selecting the specific unit cell 110.

The first switching unit 150 controls a connection between the bit line 120 and the third switching unit 170 when selecting the unit cell 110 in response to a selection signal SEL serving as an output signal of a decoder. In addition, the second switching unit 160 controls a connection between the source line 130 and the fourth switching unit 180 when selecting the unit cell 110 in response to the selection signal SEL. The third and fourth switching units 170 and 180 control a read operation in response to a read control signal RDE from an external part.

In order to show how the current IBIT flows in a path including the unit cell 110 when the non-volatile memory device performs the read operation, FIG. 1 illustrates resistance values belonging to all constituent elements.

In the non-volatile memory device such as a magnetic memory, data is stored as a resistance value in the MTJ element 112. Generally, the MTJ element 112 has a three-layered structure in which one insulation layer is located between two ferromagnetic layers. In the non-volatile memory device, a magnetization direction of the ferromagnetic layer is determined depending on a direction of a current applied to the MTJ element 112, such that a resistance value is determined depending on the current direction.

In order to obtain the data stored in the magnetic memory, a given voltage is applied to both ends of the MTJ element 112, and the current flowing in the MTJ element 112 is measured, so that it is determined whether the MTJ element 112 is in a high resistance (RH) state or a low resistance (RL) state.

For example, digital data of '0' or '1' may be determined in response to a resistance value of the MTJ element 112. Such digital data '0' and '1' may respectively represent a case in which the resistance value of the MTJ element 112 is higher than a reference resistance value and the other case in which the resistance value of the MTJ element 112 is equal to or lower than the reference resistance value. This allows a user to recognize which data is stored in the MTJ element 112.

In other words, the first case in which the MTJ element 112 has a high resistance RMTJ value means that two magnetic substances constructing the MTJ element 112 have opposite magnetization directions. On the other hand, the second case in which the MTJ element 112 has a low resistance RMTJ value means that the two magnetic substances have parallel magnetization directions.

In this case, although the resistance RMTJ value of the MTJ element 112 contained in the unit cell 110 is changed according to data, resistance values of constituent elements other than the resistor RMTJ are not changed depending on data. That is, resistance values of the first to fourth switching units 150-180 for selecting the unit cell 110 or performing the read operation, a resistance value of the bit line 120, and a resistance value of the source line 130 have fixed values that are not changed depending on data.

In the case of performing the read operation, a sensing voltage VRD for detecting data is applied to one end of the unit cell 110 and a ground voltage is applied to the other end of the unit cell 110, such that the current IBIT flowing in the unit cell 110 is measured. In this case, the sense-amp 140 compares the measured current IBIT with a reference value VREF, such that it determines whether a resistance value of the MTJ element 112 is higher or lower than the reference value VREF.

In a general non-volatile memory device, the sense-amp 140 is not individually coupled to one unit cell 110, and is coupled to a cell array including a plurality of unit cells.

In addition, during the read operation, the sensing voltage VRD passes through not only one unit cell 110 but also a plurality of constituent elements having unique resistance values, such that the current IBIT flowing in the unit cell 110 is very small when the read operation is performed.

The small current IBIT means that the intensity of a signal to be output in response to data is very low. A TMR value is used to define the signal intensity. The TMR value is defined as a specific value obtained when a difference between resistance values of two states of the MTJ element 112 is divided by a smaller one of the two resistance values. The TMR value may be represented by "TMR=(RH−RL)/RL*100[%]".

However, assuming that one MTJ element 112 in the non-volatile memory device has a TMR value of about 100%, when measuring the TMR value of the MTJ element 112 along a read path of a cell array contained in an actual non-volatile memory device, the TMR value of about 100% is reduced to a TMR value of about 30% due to parasitic resistance of other constituent elements.

In response to the voltage clamping control signal VCMP, the sense-amp 140 may apply the core voltage VCORE to the read path so as to restrict the sensing voltage VRD to a predetermined level or less, such that it substantially prevents an excessive current from being applied to the MTJ element 112 and thus physical properties of the MTJ element 112 are not broken or deteriorated.

FIG. 2 is a graph illustrating the current IBIT flowing in the read operation of the non-volatile memory device shown in FIG. 1.

Referring to FIG. 2, the sensing voltage VRD is controlled to be a predetermined level or less in response to the voltage clamping control signal VCMP. And, when the read control signal RDE, the selection signal SEL for selecting the unit cell 110, and the word line WL are activated, the current IBIT flows along the read path in response to data stored in the unit cell 110.

Thus, the current is changed depending on information stored in the MTJ element 112. That is, if the MTJ element 112 has high resistance, the current IBIT flowing in response to data is changed to a low current IH smaller than a reference current IREF. Otherwise, if the MTJ element 112 has low resistance, the current IBIT flowing in response to data is changed to a high current IL greater than the reference current IREF. In this case, the low current IH and the high current IL are not always set to a fixed value, and may change according to an operation environment.

In FIG. 2, the horizontal axis represents data current IBIT, and a vertical axis represents a relative frequency P(I) of a cell having the data current IBIT.

As shown in FIG. 2, the sense-amp 140 determines whether or not the current IBIT is greater than the reference current IREF, such that it recognizes data stored in the unit cell 110. In this case, in order to substantially prevent an error from being generated in the read operation, it is necessary for the reference current IREF to maintain the range from the low current IH to the high current IL. In order to maximize an operation margin of the sense-amp 140, it is necessary for the reference current IREF to have an intermediate value between the low current IH and the high current IL.

In the case of using an absolute reference current scheme shown in FIG. 2, the reference current IREF maintains a predetermined value, such that a circuit for generating the reference current IREF can be simplified in structure. In this case, in order to maximize the operation margin of the sense-amp 140, the cell array needs to be designed in such a manner that the relative frequency P(I) of the current IBIT is maximized.

However, it should be noted that the P(I) distribution is not always maintained in an invariable shape. The data current distribution (i.e., variation of a position of P(I) and shape variation) may be generated by a variety of reasons. A representative one of such reasons is variation in resistance existing on the read path illustrated in FIG. 1.

Specifically, the relative frequency P(I) may be affected by where the specific unit cell 110 selected in the read operation is in the cell array. That is, the bit line resistor RBL, the source line resistor RSL, resistance of transistors in the first to fourth switching units 150~180 serving as various kinds of switches, and resistance generated when the sensing voltage VRD is provided may affect the selected unit cell 110. In addition, in the process for manufacturing the non-volatile memory device, resistance variation caused by process variations of the MTJ element 112 may also encounter the variation of the P(I) position and shape.

In the case where data is sensed and amplified using the reference current IREF having an invariable value on the condition that the P(I) position and shape are changed due to the aforementioned reasons, the operation margin of the sense-amp 140 may be reduced. If worst comes to worst, a faulty operation in which data is incorrectly sensed may be generated.

FIG. 3 is a graph illustrating the current IBIT in the read operation of the non-volatile memory device so as to solve the problems shown in FIG. 2.

In order to increase the operation margin of the sense-amp 140 capable of sensing and amplifying the current IBIT flowing in the unit cell 110 during the read operation, a relative reference current scheme is used, instead of the absolute reference current scheme in which the reference current IREF has a predetermined value. The relative reference current scheme may also change the value of the reference current IREF in response to the variation of the relative frequency P(I) of the current IBIT.

The relative reference current scheme can maintain the sensing margin, such that it can readily read low-intensity information of the unit cell 110. However, in the relative reference current scheme, both the area of a circuit generating the reference current IREF and power consumption are increased so as to change the reference current IREF.

BRIEF SUMMARY OF THE INVENTION

Various embodiments of the present invention are directed to providing a non-volatile memory device that substantially obviates one or more problems due to limitations and disadvantages of the related art.

First, an embodiment of the present invention relates to a non-volatile memory device capable of verifying whether or not data stored in a reference cell array for generating a reference current used for a normal read operation is stored as predetermined. In an implementation, the non-volatile memory device is a Magneto resistive Random Access Memory having a magneto-resistance element to store information.

Second, an embodiment of the present invention relates to a non-volatile memory device employing a write verification circuit of a reference cell to generate a stable global reference current.

Third, an embodiment of the present invention relates to a non-volatile memory device for generating a global reference current varying in response to an operation environment of a unit cell array, thereby improving an operation margin of the non-volatile memory device.

Fourth, an embodiment of the present invention relates to a non-volatile memory device for substantially preventing a faulty operation from being generated in a read operation, resulting in the increased operation reliability.

In accordance with one embodiment of the present invention, a non-volatile memory device includes a cell array having a plurality of memory cells each including a resistive element, wherein a memory cell is read using resistance value of a storage element in the memory cell; a sense-amplifier configured to compare a current flowing in a memory cell selected for a read operation with a global reference current so as to sense and amplify data stored in the selected memory cell; and a global reference current generation circuit configured to generate the global reference current, wherein a level of the global reference current is changed depending on a position of the accessed unit cell.

In accordance with another embodiment of the present invention, a non-volatile memory device includes a cell array having a plurality of unit cells each including a magneto-resistance element to store data, wherein a read or write operation, or both is performed on a selected unit cell using a change in resistance of a magneto-resistance element of the selected unit cell; a reference cell array including a plurality of reference cells each having a magneto-resistance element; a global reference current generation circuit configured to generate a global reference current corresponding to a position of the reference cell so as to verify data stored in the reference cell array; and a sense-amplifier configured to compare a current flowing in the reference cell array with the global reference current during a write verification operation of the reference cell array, thereby sensing the data stored in the reference cell array.

In accordance with another embodiment of the present invention, a nonvolatile memory control method comprising generating a line voltage having a resistance value differentiated depending on location of unit cells; changing a level of a global reference current in response to the line voltage; and comparing the global reference current with a current flowing in the unit cell to sense data.

It is to be understood that both the foregoing general description and the following detailed description of the present invention are exemplary and explanatory and are intended to provide further explanation of the invention as claimed.

It will be appreciated by persons skilled in the art that that the effects that can be achieved with the present invention are not limited to what has been particularly described hereinabove and other advantages of the present invention will be more clearly understood from the following detailed description taken in conjunction with the accompanying drawings.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

In order to guarantee a margin for a stable read operation in a non-volatile memory device operating in a low-power environment, an embodiment of the present invention corrects a variation of a resistance value generated in a read path for data transmission according to an operation environment and a reference cell position, such that data can be definitely identified even though the intensity of a signal corresponding to data is very low.

Figure 4:
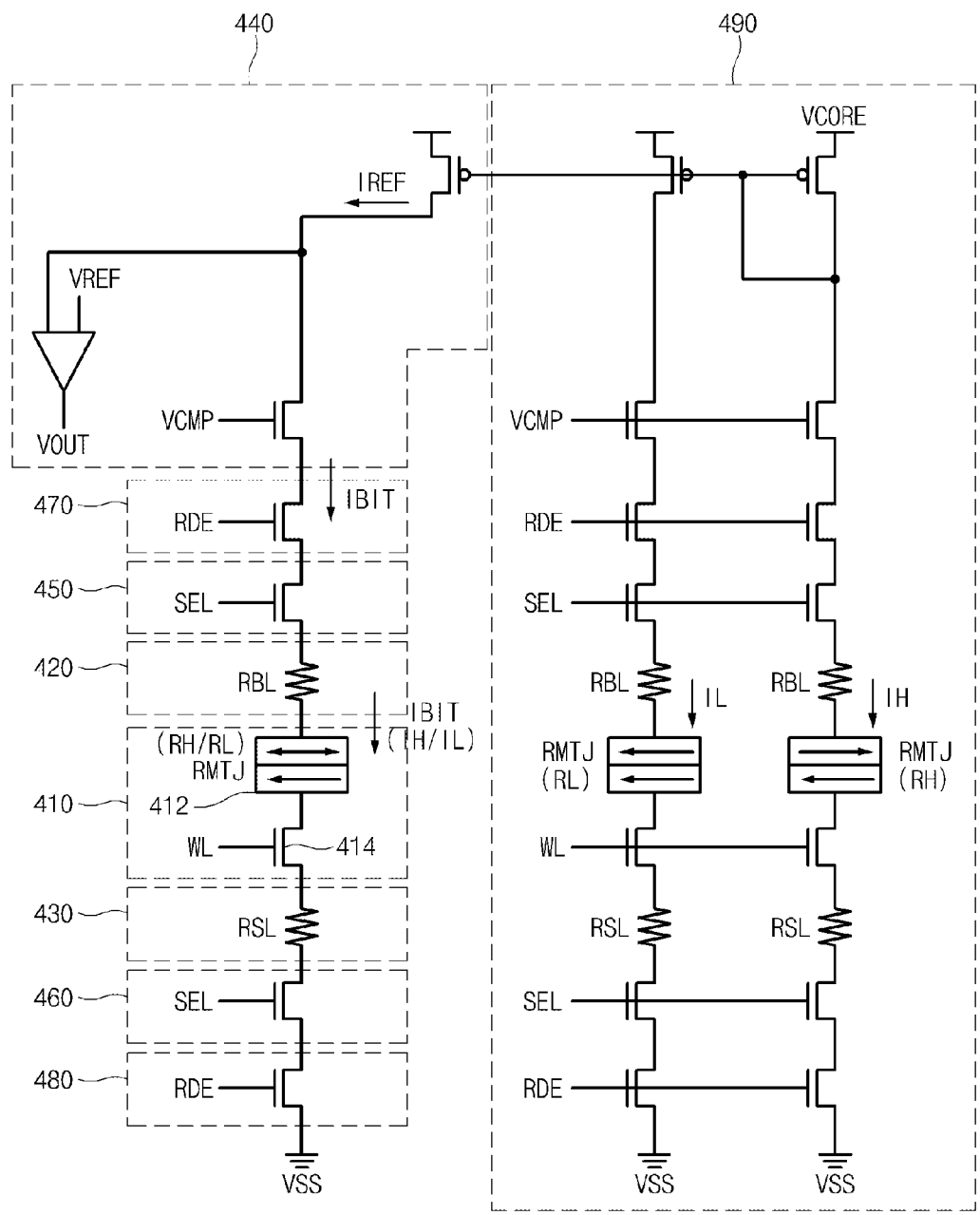
FIG. 4 is a circuit diagram illustrating a non-volatile memory device for implementing a relative reference current scheme.

FIG. 4 is a circuit diagram illustrating a non-volatile memory device for implementing a relative reference current scheme.

Referring to FIG. 4, the non-volatile memory device includes a unit cell 410, a bit line 420, a source line 430, a sense-amp 440, a first switching unit 450, a second switching unit 460, a third switching unit 470, a fourth switching unit 480, and a reference current generator 490.

In this case, the unit cell 410 includes a magnetic tunneling junction (MTJ) element 412 and a cell transistor 414. The MTJ element 412 includes a resistor RMTJ, and the cell transistor 414 is controlled by a voltage of a word line WL. In this case, the resistor RMTJ may have a resistance value RH or RL.

The bit line 420 is coupled to the MTJ element 412, such that it has a bit line resistance value RBL. The source line 430 is coupled between one end of the cell transistor 414 and the second switching unit 460, such that it has a source line resistance value RSL.

The sense-amp 440 includes a current-supply element, a switching element and an amplifier, such that it may sense and amplify data stored in the unit cell 410. In this case, the current-supply element generates a reference current IREF in response to a core voltage VCORE. The amplifier compares a voltage generated by the reference current IREF with a reference voltage VREF, and outputs an output voltage VOUT according to the result of the comparison. The switching element is controlled by a voltage clamping control signal VCMP, such that it controls a level of the bit line current IBIT generated by the reference current IREF.

When the first switching unit 450 selects the unit cell 410 in response to a selection signal SEL acting as an output of a decoder, it controls a connection between the bit line 420 and the third switching unit 470. In addition, when the second switching unit 460 selects the unit cell 110 in response to the selection signal SEL, it controls a connection between the source line 430 and the fourth switching unit 480. The third and fourth switching units 470 and 480 control a read operation in response to a read control signal RDE received from an external part.

Figure 1:
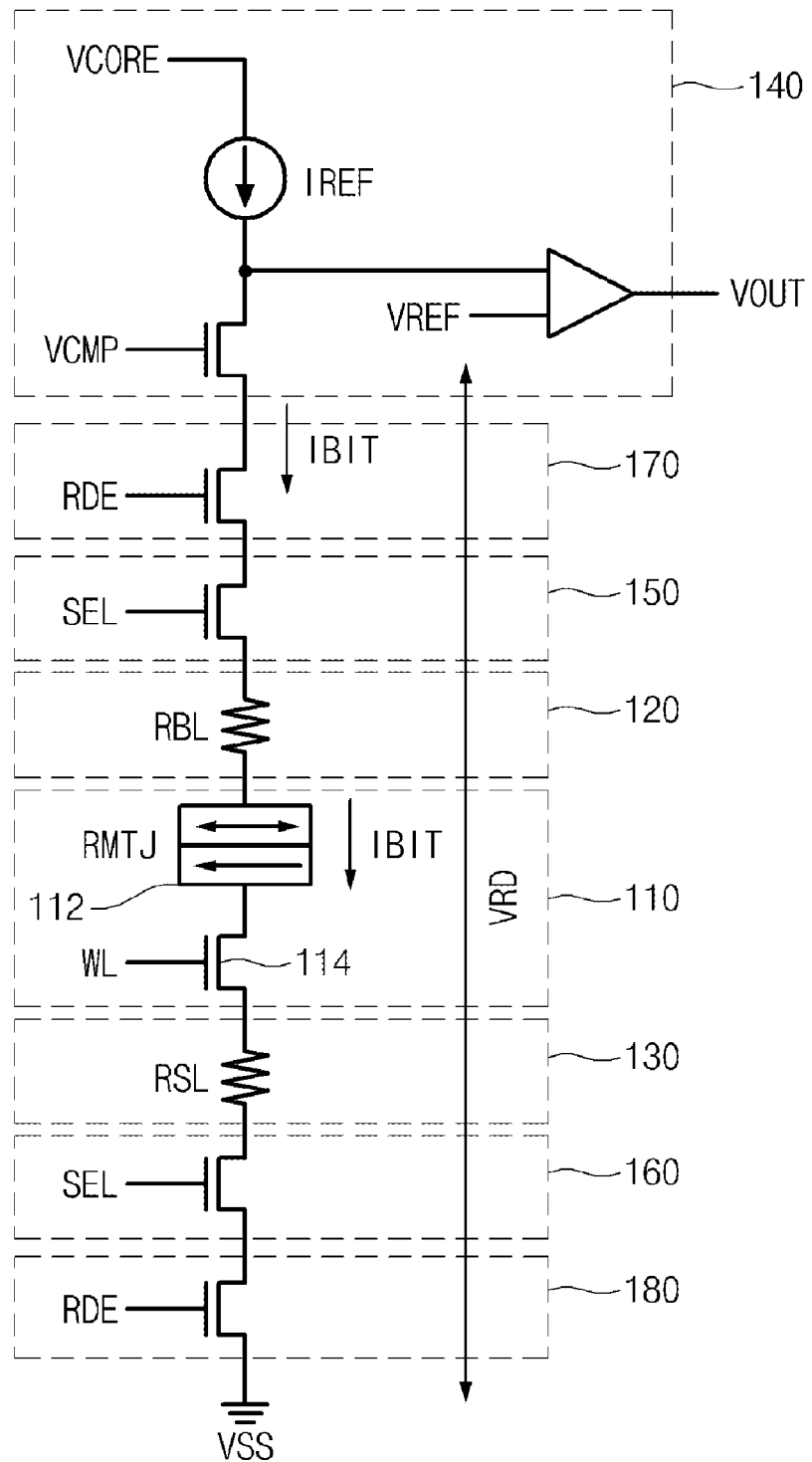
FIG. 1 is a circuit diagram illustrating a read operation of a non-volatile memory device according to the related art.
Figure 2:
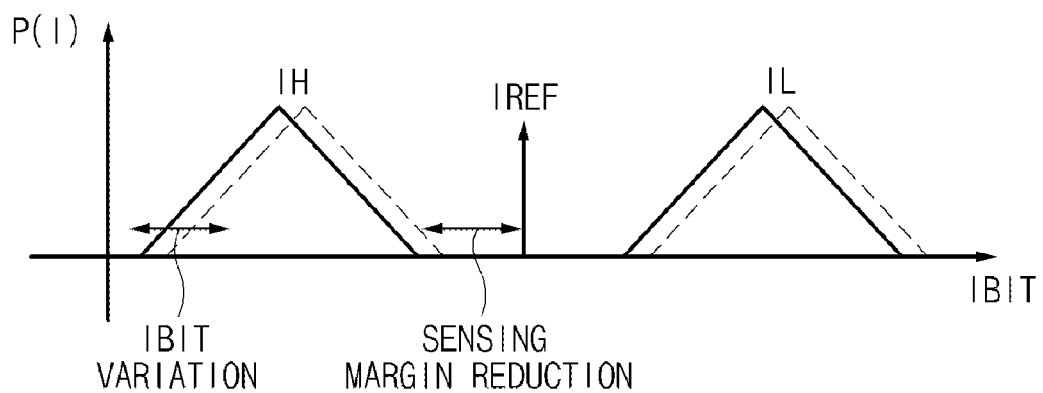
FIG. 2 is a graph illustrating a current in the read operation of the non-volatile memory device shown in FIG. 1.
Figure 3:
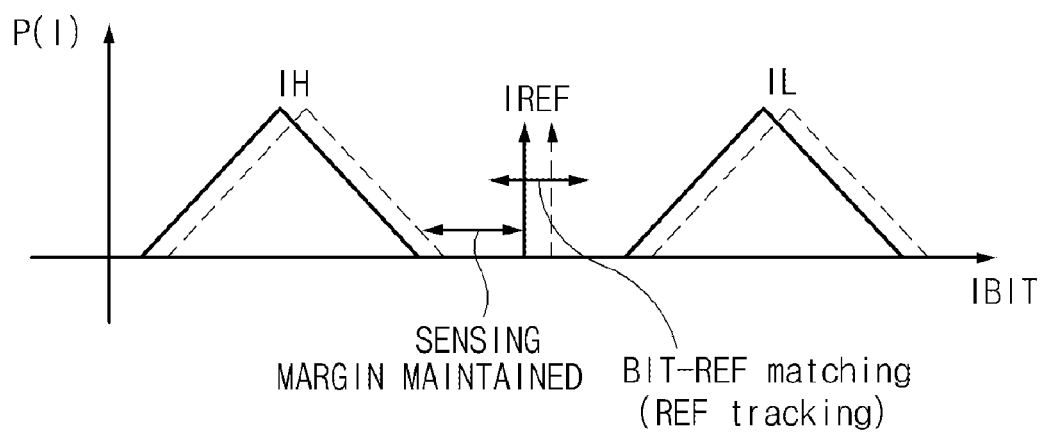
FIG. 3 is a graph illustrating a current in a read operation of a non-volatile memory device.

The sense-amp 140 of the non-volatile memory device shown in FIG. 1 is designed to sense data using the absolute reference current scheme for employing the reference current IREF having a predetermined value as shown in FIG. 2.

On the other hand, the non-volatile memory device based on the relative reference current scheme further includes the reference current generator 490 as shown in FIG. 4.

The reference current generator 490 duplicates a path where the read operation is performed. Because a plurality of constituent elements contained in the read path are duplicated, although the variation of a relative frequency P(I) of the current IBIT occurs in the read path during the read operation, the varied relative frequency P(I) is also applied to the reference current generator 490, such that the reference current IREF can also be changed.

The reference current generator 490 includes two paths made by the duplication of the read path, and is characterized in that one MTJ element contained in either one of the two paths has high resistance RL and the other MTJ element has low resistance RH. The high current IL flowing in response to data '0' and the low current IH flowing in response to the other data '1' can be implemented at the two paths, and source terminals of two NMOS transistors each receiving the voltage clamping control signal VCMP as a gate voltage are short-circuited. Thus, the reference current generator 490 may output an intermediate value between the low current IH and the high current IL as the reference current IREF so as to maximize the operation margin of the sense-amp 440.

Figure 5:
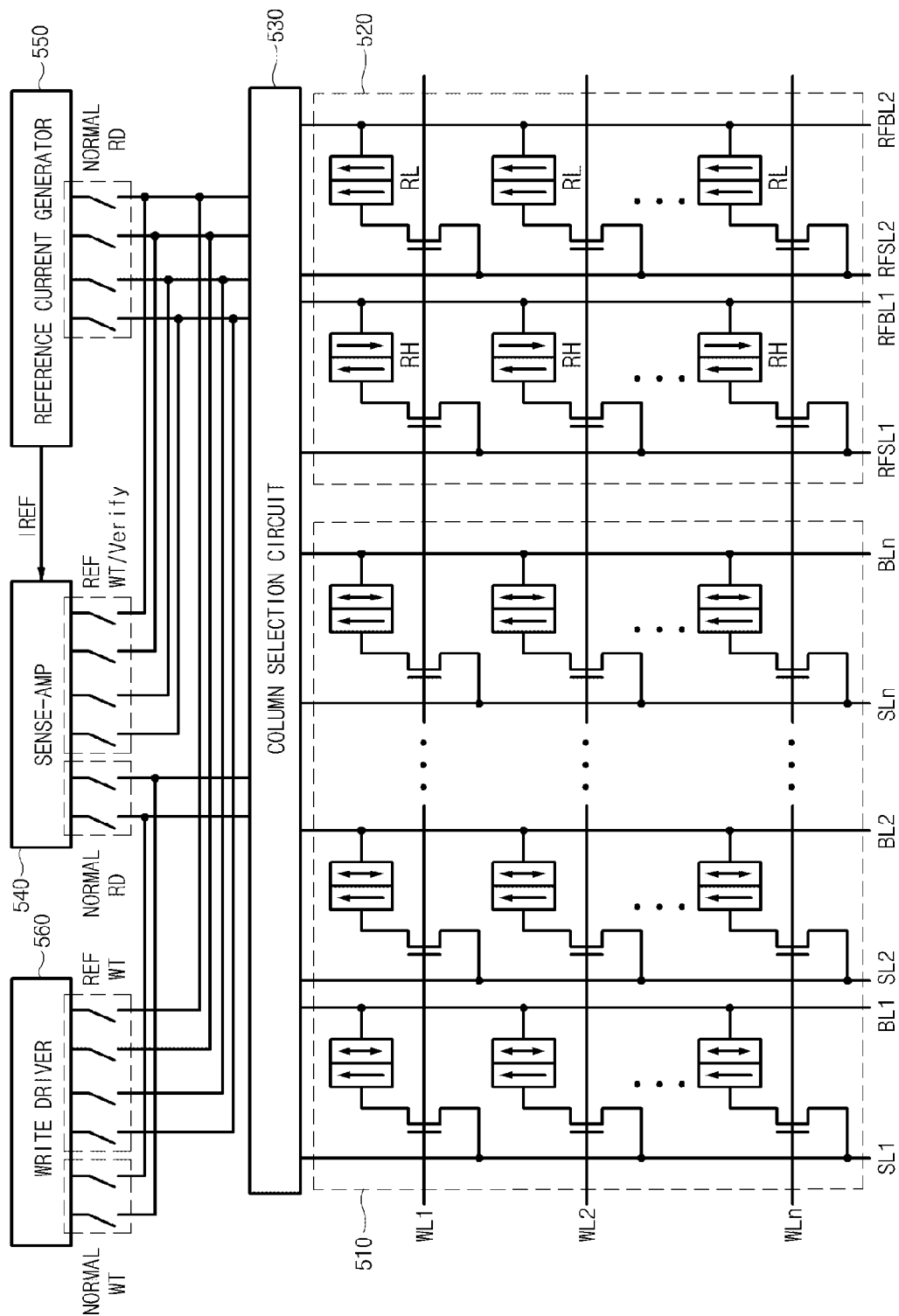
FIG. 5 is a circuit diagram illustrating another example of a non-volatile memory device for implementing the relative reference current scheme.

FIG. 5 is a circuit diagram illustrating another example of the non-volatile memory device for implementing the relative reference current scheme.

Referring to FIG. 5, the non-volatile memory device includes a cell array 510, a reference cell array 520, a column selection circuit 530, a sense-amp 540, a reference current generator 550, and a write driver 560.

The cell array 510 includes a plurality of unit cells in intersection areas of a plurality of word lines WL1~WLn, a plurality of source lines SL1~SLn, and a plurality of bit lines BL1~BLn.

The reference cell array 520 includes a plurality of unit cells in intersection areas of a plurality of word lines WL1~WLn, a plurality of reference source lines RFSL1 and RFSL2, and a plurality of reference bit lines RFBL1 and RFBL2, and is formed as a duplicate of the cell array 510. The column selection circuit 530 may selectively access the cell array 510 or the reference cell array 520.

In a normal read operation or a write/verification operation of a reference cell, the sense-amp 540 may sense and amplify data from the selected unit cell contained in the cell array 510 or the reference cell array 520. The reference current generator 550 is coupled to the reference cell array 520, such that it provides the reference current IREF to the sense-amp 540 during the normal read operation.

In the normal write operation or the reference cell's write operation, the write driver 560 provides a write voltage to the cell array 510 or the reference cell array 520. At this time, during the normal write operation, the write driver 560 may write data in the cell array 510 using a switching unit Normal WT.

In order to read data stored in the unit cell in the non-volatile memory device based on the relative reference current scheme, the reference current IREF needs to be clarified. It is necessary for each MTJ element contained in the reference cell array 520 for generating the reference current IREF to correctly store either low resistance RH or high resistance RL in response to data '0' or data '1,' respectively.

In this case, when storing data '0' or data '1' in the reference cell array 520 so as to read data stored in the cell array 510, the write driver 560 may write data in the reference cell array 520 instead of the cell array 510 using the switching unit REF WT.

However, after completing the write operation in the reference cell array 520, it is impossible to verify whether or not data stored in the unit cell of the reference cell array 520 has correct resistance (RH or RL).

After completing the write operation in the reference cell array 520, a switching unit REF WT/Verify contained in the sense-amp 540 is turned on to verify whether or not data is correctly written in the reference cell of the reference cell array 520. In this case, if the switching unit REF WT/Verify is turned on when verifying the reference cell array 520, the sense-amp 540 compares a current of the reference cell array 520 with the reference current IREF.

That is, in the case of data stored in the cell array 510, the reference current IREF generated by the reference cell array 520 and the reference current generator 550 may be changed in response to variables generated in the actual read operation.

However, an unexpected problem may be caused in which it is difficult to definitely recognize data stored in the reference cell array 520 due to the operation environment of the non-volatile memory device. That is, line resistance and a fabrication process may be changed in response to a position of the reference cell, such that properties of data stored in the reference cell array 520 are changed according to the variation of the operation environment. Therefore, unless the above-mentioned data properties and variables changed in response to the operation environment are considered, it is impossible to accurately recognize the data stored in the reference cell array 520.

If it is difficult to accurately recognize the data stored in the reference cell array 520, the reliability of the read operation of the non-volatile memory device may be deteriorated.

Figure 6:
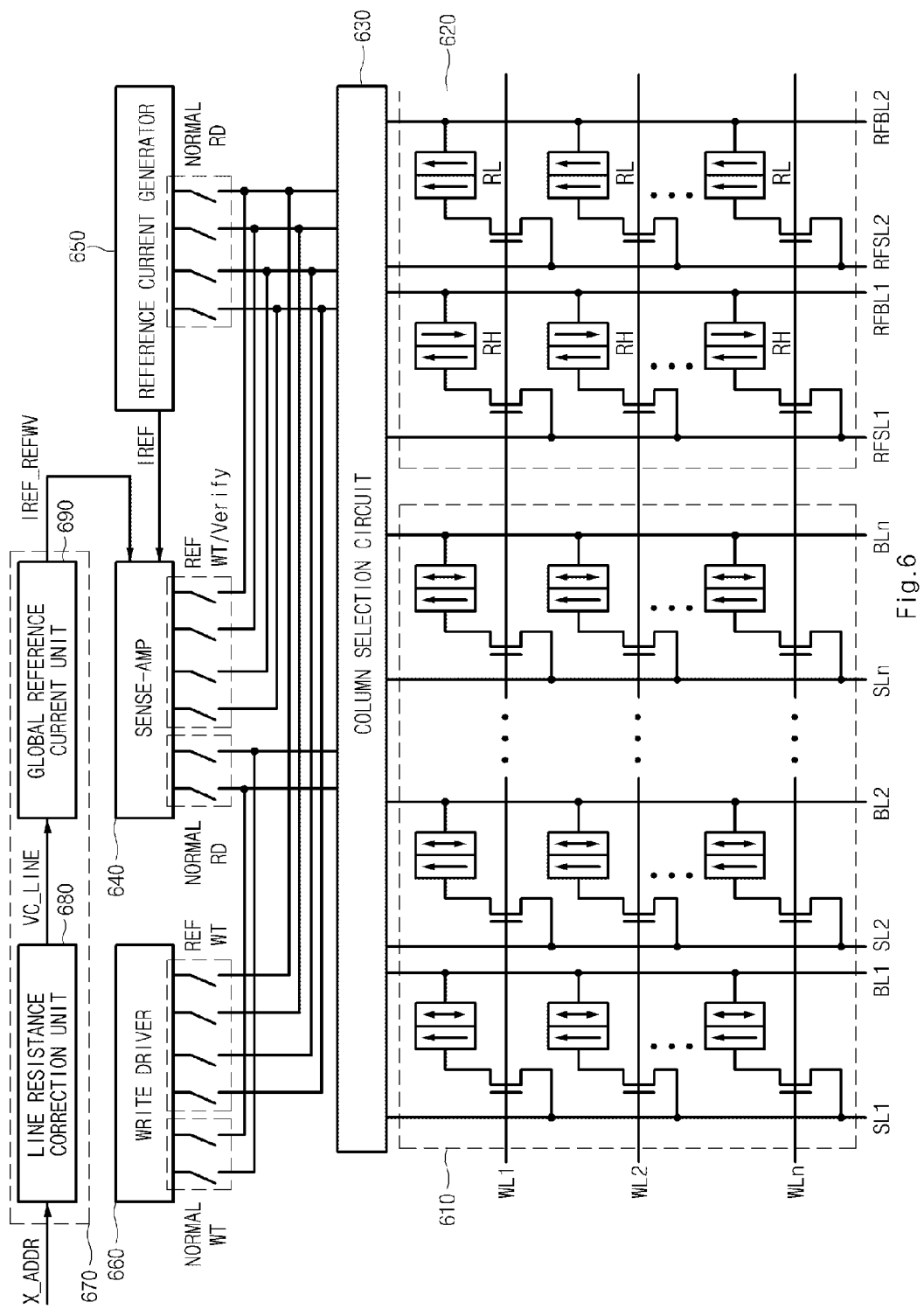
FIG. 6 is a circuit diagram illustrating a non-volatile memory device according to an embodiment of the present invention.

FIG. 6 is a circuit diagram illustrating a non-volatile memory device according to an embodiment of the present invention.

Referring to FIG. 6, the non-volatile memory device includes a cell array 610, a reference cell array 620, a column selection circuit 630, a sense-amp 640, a reference current generator 650, a write driver 660 and a global reference current generation circuit 670. In this case, the global reference current generation circuit 670 includes a line resistance correction unit 680 and a global reference current unit 690.

The cell array 610 includes a plurality of unit cells (or memory cells) in intersection areas of a plurality of word lines WL1~WLn, a plurality of source lines SL1~SLn and a plurality of bit lines BL1~BLn.

The reference cell array 620 includes a plurality of unit cells in intersection areas of a plurality of word lines WL1~WLn, a plurality of reference source lines RFSL1 and RFSL2, and a plurality of reference bit lines RFBL1 and RFBL2, and is formed as a duplicate of the cell array 610.

The column selection circuit 630 may selectively access the cell array 610 or the reference cell array 620.

In an embodiment, the non-volatile memory device is a Magneto resistive Random Access Memory (or MRAM) having magnetic storage elements. The magnetic memory has a signal intensity that is relatively less than those of other memories. Therefore, in order to stably provide the read operation margin, the magnetic memory includes the reference cell array 620 matched with the main cell array 610 in such a manner that variation of several resistances generated from a read path can be compensated.

The sense-amp 640 may sense and amplify data from a selected unit cell of the cell array 610 during a normal read operation. During the normal read operation, a reference current IREF generated from the reference cell array 620 and the reference current generator 650 is provided to the sense-amp 640.

In this case, the reference current generator 650 is coupled to the reference cell array 620, and the switching unit Normal RD is turned on during the normal read operation, so that the reference current IREF is provided to the sense-amp 640.

After completing a write operation in the reference cell array 620, a switching unit REF WT/Verify contained in the sense-amp 640 is turned on to determine whether or not data is correctly written in a reference cell of the reference cell array 620. At this time, once the switching unit REF WT/Verify is turned on during a verification operation of the reference cell array 620, the sense-amp 640 selects a global reference current IREF_REFWV instead of the reference current IREF.

During either the normal write operation or the reference cell write operation, the write driver 660 provides a write voltage to the cell array 610 or the reference cell array 620. In this case, during the write operation of the normal cell, the write driver 660 may write or record data in the cell array 610 using a switching unit Normal WT). On the other hand, during the write operation of the reference cell, the write driver 660 may write data in the reference cell array 620 using a switching unit REF WT.

Prior to performing an operation on the magnetic memory, reference data is typically stored in the reference cell array 620 prior to executing an operation on the cell array 610. Accordingly, in order to determine whether data is correctly stored in the reference cell array 620 during the write verification operation of the reference cell array 620, the global reference current generation circuit 670 is needed.

The global reference current generation circuit 670 may include a specific function capable of correcting a reference current according to the position of the reference cell in the reference cell array 620. In addition, the global reference current generation circuit 670 may include a specific function capable of correcting a reference current according to the process variation of a transistor that receives not only a control signal generated in the read operation but also a selection signal.

During the write verification operation of the reference cell array 620, the line resistance correction unit 680 corrects resistance variation depending on the length of several lines (such as a bit line, a source line, and a global bit line, etc.) that are changed according to the reference cell position. The line resistance correction unit 680 corrects the resistance variation according to a row address X_ADDR, such that it outputs a line voltage VC_LINE.

The global reference current unit 690 generates the global reference current IREF_REFWV for identifying data '0' or data '1' in response to the line voltage VC_LINE output from the line resistance correction unit 610, and the global reference current IREF_REFWV is provided to the sense-amp 640.

The global reference current generation circuit 670 is coupled to the sense-amp 640, such that the sense-amp 640 can recognize whether data '0' or data '1' is properly stored in the reference cell array 620. The global reference current generation circuit 670 is adapted to identify the adaptability of data stored in the reference cell array 620.

The line resistance correction unit 680 receives an address of the accessed unit cell as an input, and outputs resistance variation depending on a bit line (BL) length that is variable with a distance between the unit cell and either the sense-amp 640 or the column selection circuit 630.

In this case, the bit line BL is shared by a plurality of unit cells configured in units of a column, and an address of a unit cell is changed according to the row address X_ADDR. Based on only the row address X_ADDR within the cell array 610, the length of the bit line BL coupled to the unit cell, i.e., the distance between the bit line BL and the unit cell, and the length of the source line SL coupled to the unit cell, i.e., the distance between the source line SL and the unit cell, are established in a design stage. The length of the bit line BL coupled to the unit cell, the length of the source line SL coupled to the unit cell and the like may be proportionally changed in response to the unit cell position. In addition, the resistance of each line is increased in proportion to the line length, and the resistance variation caused by the increased line resistance is gradually increased.

Figure 7A:
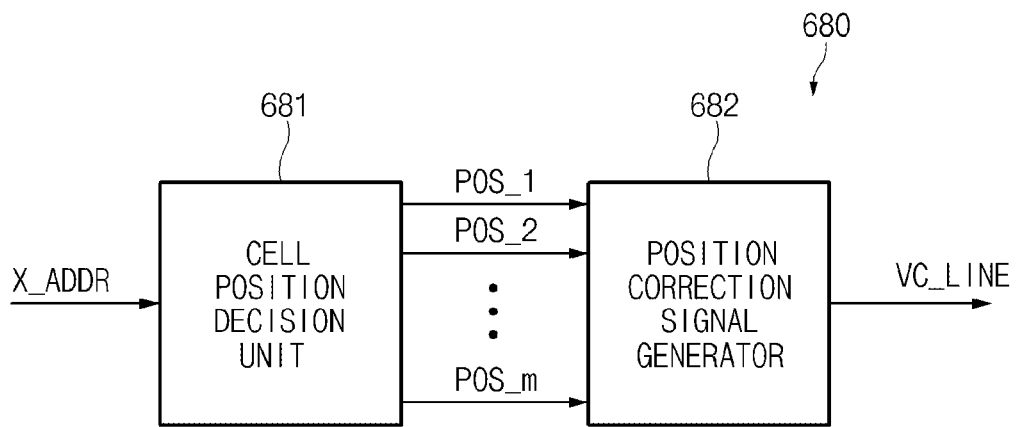
FIG. 7A is a block diagram illustrating a line resistance correction unit shown in FIG. 6 according to an embodiment of the present invention.

FIG. 7A is a block diagram illustrating the line resistance correction unit 680 shown in FIG. 6 according to an embodiment of the present invention.

Referring to FIG. 7A, the line resistance correction unit 680 includes a cell position decision unit 681 and a position correction signal generator 682.

The cell position decision unit 681 receives the row address X_ADDR as an input and outputs a plurality of position signals POS_1~POS_m including position information of a unit cell to be accessed, 'm' being a positive integer. The position correction signal generator 682 outputs the line voltage VC_LINE in which resistance values corresponding to the position signals POS_1~POS_m are reflected.

The cell position decision unit 681 decodes the row address X_ADDR, i.e., an address of an activated word line, of the unit cell and outputs the plurality of position signals POS_1~POS_m. In this case, the cell position decision unit 681 receives as many row addresses X_ADDR as the number of bits corresponding to rows of the cell array 610 including the unit cell.

Since the cell position decision unit 681 can be implemented as a simple logic circuit for activating any one of sequentially-arranged position signals POS_1~POS_m, a decoding algorithm and implementation may be easily appreciated by those skilled in the art to which the present invention pertains without difficulty. Therefore, a detailed description thereof will be omitted for convenience of description.

Figure 7B:
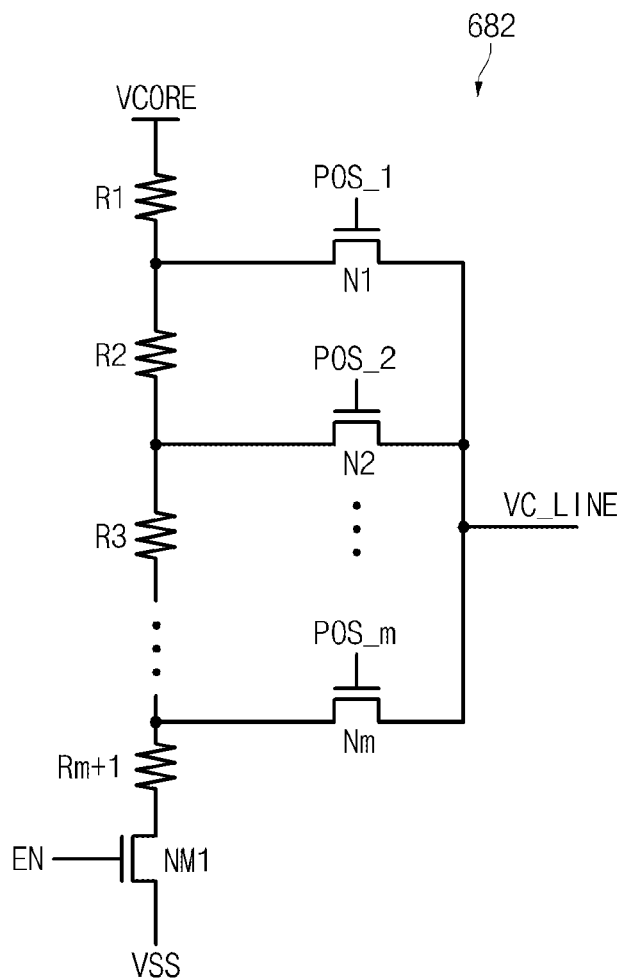
FIG. 7B is a circuit diagram illustrating a position correction signal generator shown in FIG. 7A according to an embodiment of the present invention.

FIG. 7B is a circuit diagram illustrating the position correction signal generator 682 shown in FIG. 7A according to an embodiment of the present invention.

Referring to FIG. 7B, the position correction signal generator 682 includes a voltage divider, a position signal controller, and an activation unit.

In this case, the voltage divider includes a plurality of resistors R1~Rm+1 coupled in series between a core voltage (VCORE) input terminal and the activation unit.

The position signal controller includes a plurality of NMOS transistors N1~Nm coupled in parallel between the plurality of resistors R1~Rm+1 and a line voltage (VC_LINE) output terminal. Switching operations of the NMOS transistors N1~Nm are controlled by the plurality of position signals POS_1~POS_m. That is, the NMOS transistors N1~Nm are selectively turned on in response to any of activated signals from among the plurality of position signals POS_1~POS_m, and thus a voltage difference between a voltage at a certain node of the voltage divider corresponding to the activated signal and a ground voltage VSS is output as the line voltage VC_LINE.

For example, the position correction signal generator 682 may be implemented by modeling the bit line BL coupled to a plurality of unit cells. Respective unit cells have different bit line (BL) lengths. The resistance variation caused by the bit line lengths is output as the line voltage VC_LINE, and the modeling is implemented using the plurality of resistors R1~Rm+1.

In other words, it is assumed that data stored in a reference cell farthest from the sense-amp 640 is verified. The cell position decision unit 681 outputs the last position signal POS_m from among the plurality of position signals POS_1~POS_m as a logic high level H in response to the row address X_ADDR, and outputs the remaining position signals POS_1~POS_m−1 other than the position signal POS_m as a logic low level L.

In this case, the NMOS transistor Nm is turned on in response to the position signal POS_m. Therefore, the line voltage VC_LINE output from the position correction signal generator 682 has a minimum voltage level loaded on the lowermost resistor Rm+1 of the voltage divider.

At this time, a channel resistance of an NMOS transistor N51, which will be described subsequently, is increased in response to the line voltage VC_LINE having the minimum voltage level, such that the bit line resistance RBL and the source line resistance RSL are increased.

On the other hand, it is assumed that data stored in a reference cell closest to the sense-amp 640 is verified. The cell position decision unit 681 outputs the first position signal POS_1 from among the plurality of position signals POS_1~POS_m as a logic high level H in response to the row address X_ADDR, and outputs the remaining position signals POS_2~POS_m other than the position signal POS_1 as a logic low level L.

In this case, the NMOS transistor N1 is turned on in response to the position signal POS_1. Therefore, the line voltage VC_LINE output from the position correction signal generator 682 has a maximum voltage level loaded on the uppermost resistor R1 of the voltage divider.

At this time, the channel resistance of the NMOS transistor N51 is decreased in response to the line voltage VC_LINE having the maximum voltage level, such that the bit line resistance RBL and the source line resistance RSL are decreased.

Meanwhile, the activation unit includes an NMOS transistor NM1 coupled to a lower end of the voltage divider of the position correction signal generator 682. The NMOS transistor NM1 is coupled between the voltage divider and a ground voltage (VSS) input terminal, and an enable signal EN is input to a gate terminal of the NMOS transistor NM1. The activation unit may be activated in response to the enable signal EN as necessary, such that it substantially prevents power from being unnecessarily consumed.

Figure 7C:
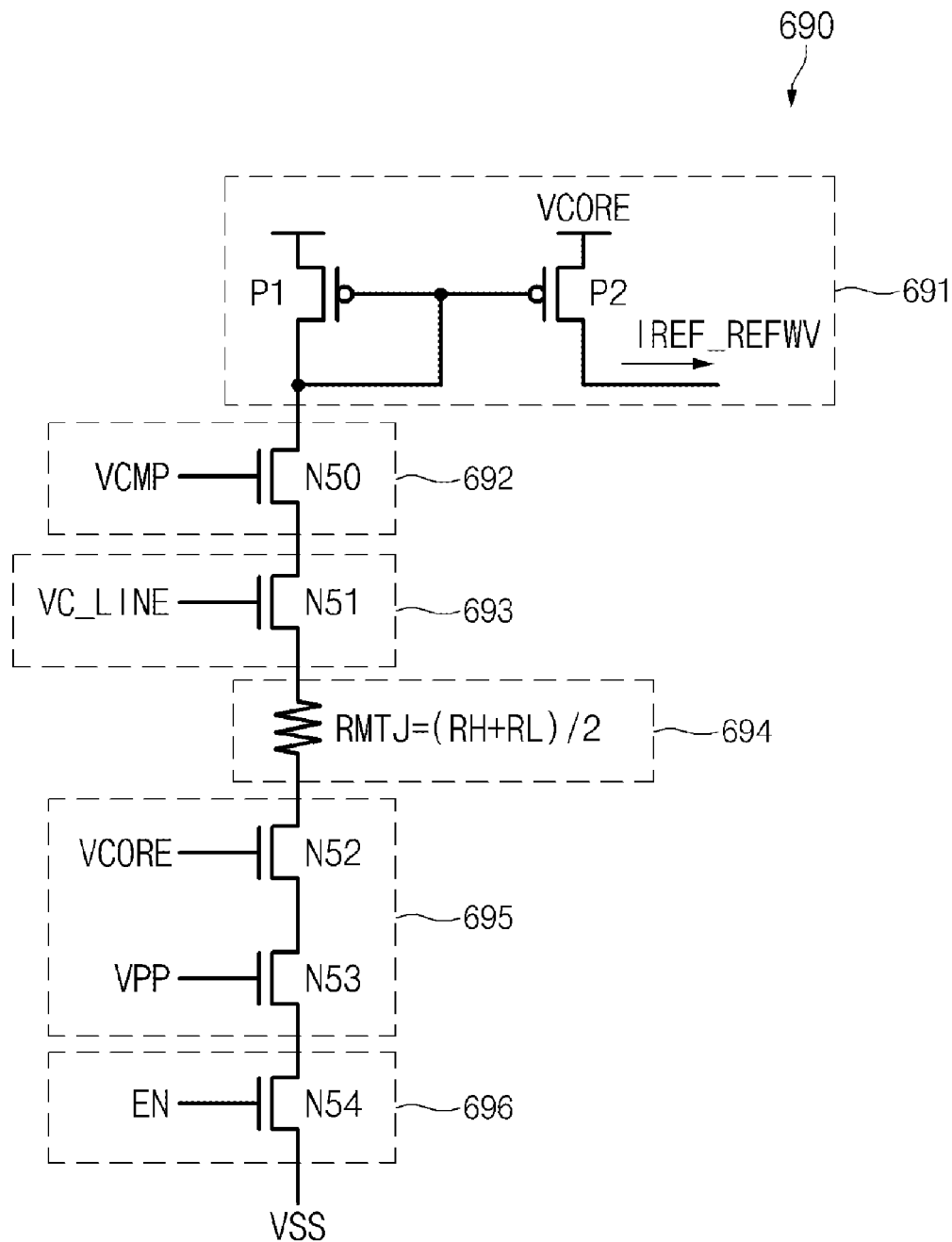
FIG. 7C is a circuit diagram illustrating a global reference current unit shown in FIG. 6 according to an embodiment of the present invention.

FIG. 7C is a circuit diagram illustrating the global reference current unit 690 shown in FIG. 6 according to an embodiment of the present invention.

Referring to FIG. 7C, the global reference current unit 690 includes a reference current output unit 691, a clamp voltage unit 692, a line voltage unit 693, an MTJ resistor unit 694, a cell transistor unit 695, and an activation unit 696.

The reference current output unit 691 includes PMOS transistors P1 and P2. The PMOS transistors P1 and P2 perform mirroring of a current flowing in the resistor RMTJ in response to the core voltage VCORE, and the mirroring result is output as the global reference current IREF_REFWV.

The clamp voltage unit 692 includes an NMOS transistor N50, which is coupled between the reference current output unit 691 and the line voltage unit 693 and is controlled by a voltage clamping control signal VCMP. The NMOS transistor N50 is switched in response to the voltage clamping control signal VCMP for substantially preventing the flow of over current. In this case, the NMOS transistor N50 may be modeled to use the same power source and transistor as those of a sense-amp block of the sense-amp 640.

The line voltage unit 693 includes an NMOS transistor N51, which is coupled between the clamp voltage unit 692 and the MPTJ resistor unit 694 and is controlled by the line voltage VC_LINE. The NMOS transistor N51 serves as a resistor corresponding to the line voltage VC_LINE output from the position correction signal generator 682.

In this case, the NMOS transistor N51 is modeled in consideration of line resistance variation affected by a position of a reference cell to be used as a write-verification object. In other words, the bit line resistance (RBL) variation and the source line resistance (SBL) variation are corrected by channel resistance in the NMOS transistor N51 that receives the line voltage VC_LINE through its gate terminal.

The MTJ resistor 694 includes a fixed resistor RMTJ coupled between the line voltage unit 693 and the cell transistor unit 695. The fixed resistor RMTJ has an intermediate value (RH+RL)/2 between one resistance RH corresponding to data '0' and the other resistance RL corresponding to data '1'.

The cell transistor unit 695 includes NMOS transistors N52 and N53. The NMOS transistor N52 is coupled between the MTJ resistor unit 694 and the NMOS transistor N53, and receives the core voltage VCORE through a gate terminal. The NMOS transistor N53 is coupled between the NMOS transistor N52 and the activation unit 696, and receives a pumping voltage VPP through a gate terminal.

The NMOS transistors N52 and N53 perform modeling for the switching of a cell transistor on a read path including the unit cell. In this case, the NMOS transistor N52 performs modeling for an NMOS transistor which receives the read control signal RDE as an input, and the NMOS transistor N53 performs modeling for the cell transistor.

The resistance variation of the transistors receiving a variety of signals (i.e., the write verification control signal, the reference column selection signal, etc.) as input signals is corrected by means of channel resistances in the NMOS transistors N52 and N53.

In the meantime, the activation unit includes an NMOS transistor N54, that is coupled between the cell transistor unit 695 and the ground voltage (VSS) input terminal and receives the enable signal EN through a gate terminal.

The above-mentioned NMOS transistors N50~N54 may select the channel width and length of each transistor in such a manner that the variation of transistors in the unit cells can be represented on average by analyzing properties of the unit cells.

The global reference current unit 690 duplicates transistors on the read path. The line resistance value varying with the reference cell position may be replaced with the NMOS transistor N51 which is capable of changing a resistance value between source and drain terminals in response to the line voltage VC_LINE output from the position correction signal generator 682.

For example, it is assumed that data stored in a reference cell closest to the sense-amp 640 is identified. The line voltage VC_LINE output from the position correction signal generator 682 reaches the maximum value, such that a resistance value of the NMOS transistor N51 contained in the global reference current unit 690 is decreased.

In contrast, if it is assumed that data stored in a reference cell farthest from the sense-amp 640 is identified, the line voltage VC_LINE output from the position correction signal generator 682 reaches the minimum value, such that a resistance value of the NMOS transistor N51 contained in the global reference current unit 690 is increased.

In accordance with the embodiment of the present invention, it is possible to generate the global reference current IREF-REFWV in which a line resistance value varying with a position of the accessed reference cell is reflected. In addition, because the global reference current unit 690 is formed by modeling the read path, it is possible to generate the global reference current IREF_REFWV in response to the operation environment of the non-volatile memory device.

The embodiment of the present invention corrects not only the line resistance variation affected by the reference cell position but also the transistor properties affected by the process variation, such that it is possible to definitely identify data stored in the reference cell array 620.

This means that the reference current for identifying data stored in the cell array 610 during the read operation can be properly changed according to the unit cell position and the operation environment. As a result, the maximum operation margin can be guaranteed during the read operation of the non-volatile memory device.

Figure 8:
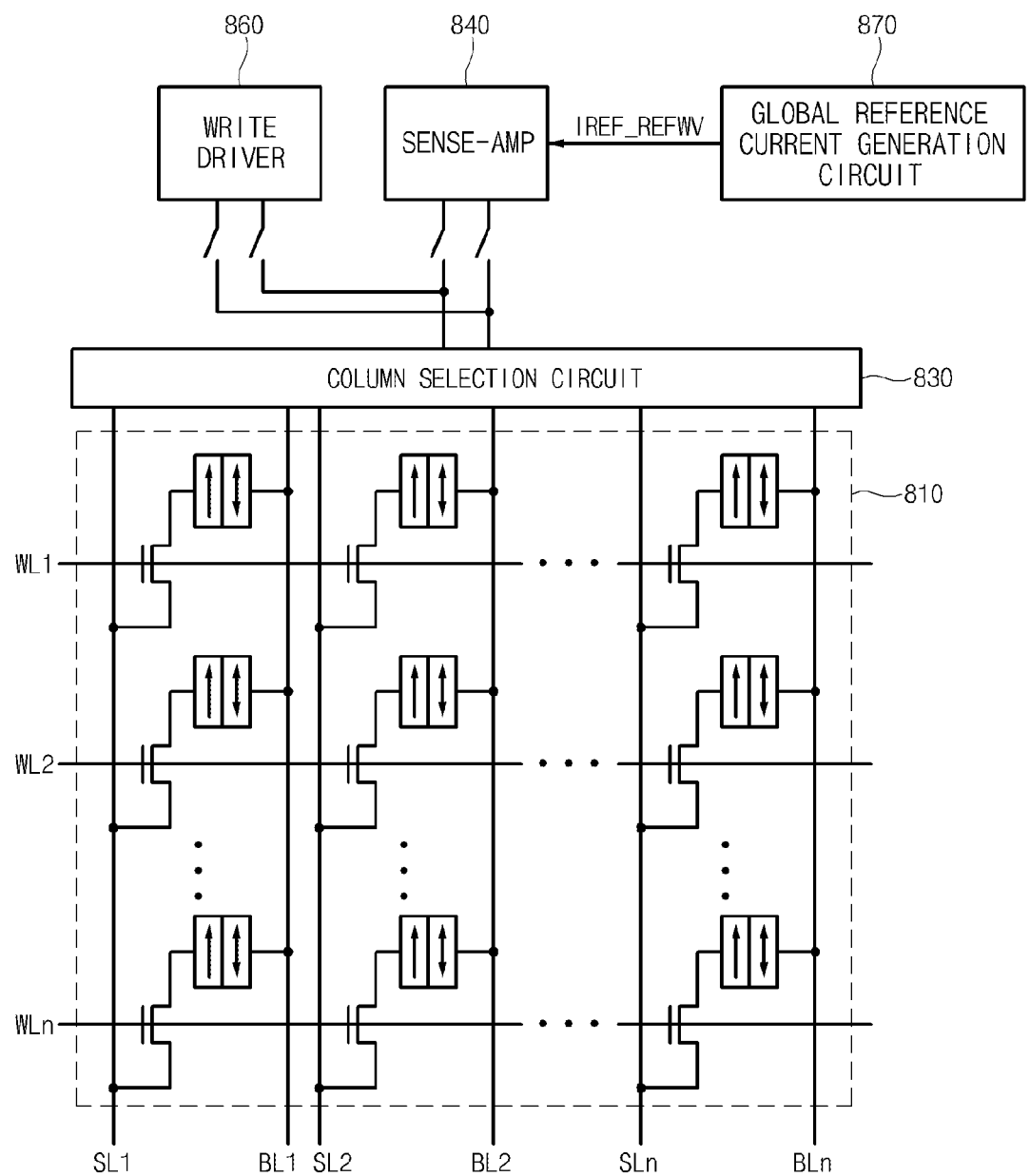
FIG. 8 is a circuit diagram illustrating a non-volatile memory device according to another embodiment of the present invention.

FIG. 8 is a circuit diagram illustrating a non-volatile memory device according to another embodiment of the present invention.

Referring to FIG. 8, the non-volatile memory device includes a cell array 810, a column selection circuit 830, a sense-amp 840, a write driver 860, and a global reference current generation circuit 870.

The cell array 810 includes a plurality of unit cells (or memory cells) within intersection areas of a plurality of word lines WL1~WLn, a plurality of source lines SL1~SLn and a plurality of bit lines BL1~BLn. The column selection circuit 830 may selectively access the cell array 810.

The sense-amp 840 may sense and amplify data from a selected unit cell of the cell array 810 during a normal read operation. The write driver 860 provides a write voltage to the cell array 810 during a normal write operation.

The global reference current generation circuit 870 provides a global reference current IREF_REFWV to the sense-amp 840. The global reference current generation circuit 870 is substantially the same as the global reference current generation circuit 670 shown in FIG. 6, and thus a detailed description thereof will be omitted for convenience of description.

One difference between the embodiment of FIG. 6 and the embodiment of FIG. 8 is that the latter does not include the reference cell array 620. The embodiment of FIG. 8 is characterized in that the global reference current IREF_REFWV output from the global reference current generation circuit 870 is used to identify data stored in a unit cell of the cell array 810.

Unlike the global reference current generation circuit 670 shown in FIG. 6, the reference current generation circuit 870 is configured to generate the global reference current IREF_REFWV in response to the position of the unit cell contained in the cell array 810 and not the position of the reference cell.

Therefore, the global reference current generation circuit 870 may be used instead of the reference cell array 520 and the reference current generator 550. When identifying data stored in the unit cell using the global reference current generation circuit 870, the additional reference cell array 520 is not required, and there is no need to check whether or not data is normally stored in the reference cell array 520.

Therefore, the write driver 860 and the sense-amp 840 contained in the non-volatile memory device can be simplified, and an area occupied by the reference cell array 520 can be reduced, such that an integration degree of the non-volatile memory device can be increased.

As described above, the embodiments of the present invention can identify data in consideration of not only the operation environment (e.g., temperature and voltage) of the read operation but also the intensity of the data signal varying with the position of the accessed unit cell.

Specifically, by using a circuit capable of generating a reference current in which internal resistance is changed according to the position of the unit cell and the operation environment, the embodiments of the present invention can increase the read operation margin of the non-volatile memory device and provides increased operation stability.

As apparent from the above description, the above-mentioned embodiments of the present invention have one or more of the following characteristics.

First, the non-volatile memory device for storing data in a resistor element contained in the unit cell corrects a resistance value that varies according to not only the position of the accessed cell array but also the operation environment so as to definitely identify a value of data stored in the reference cell array generating the reference current, such that the operation reliability of the non-volatile memory device can be increased.

Second, the non-volatile memory device can correct a resistance value that varies according to the position of the reference cell array for generating the reference current, and implement a single global reference current generation circuit irrespective of positions of several reference cell arrays, such that an overall circuit area contained in the non-volatile memory device can be reduced.

Third, the global reference current is differently generated in response to the operation environment of the unit cell array, such that the operation margin of the non-volatile memory device can be increased.

Fourth, the non-volatile memory device according to the embodiment of the present invention substantially prevents a faulty operation from being generated in the read operation, resulting in increased operation reliability.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A non-volatile memory device comprising:
    a cell array including a plurality of memory cells each including a storage element, wherein a memory cell is read using a resistance value of a storage element in the memory cell;
    a sense-amplifier configured to compare a current flowing in a memory cell selected for a read operation with a global reference current so as to sense and amplify data stored in the selected memory cell; and
    a global reference current generation circuit configured to detect a position of the selected memory cell based on a row address for accessing the selected memory cell and generate the global reference current having a level that varies depending on the position of the selected memory cell.

2. The non-volatile memory device according to claim 1, wherein information is written to a memory cell in the cell array by changing a resistance value of a storage element of the memory cell, the storage element including a magneto-resistive element.

3. The non-volatile memory device according to claim 1, wherein the global reference current generation circuit includes:
    a line resistance correction unit configured to output a line voltage having a voltage level varying depending on the position of the selected memory cell; and
    a global reference current unit configured to output the global reference current in response to the line voltage.

4. The non-volatile memory device according to claim 3, wherein the line resistance correction unit is configured to control the voltage level of the line voltage differently according to each length of a bit line and a source line that are coupled to the selected memory cell.

5. The non-volatile memory device according to claim 3, wherein the line resistance correction unit includes:
    a cell position decision unit configured to output a plurality of position signals upon receiving the row address of the selected memory cell; and
    a position correction signal generator configured to output the line voltage having a different voltage level in response to the plurality of position signals.

6. The non-volatile memory device according to claim 5, wherein the position correction signal generator includes:
    a voltage divider in which a plurality of resistors are connected in series;
    a plurality of switches which are connected in parallel to the plurality of resistors and control the voltage level of the line voltage in response to the plurality of position signals; and
    an activation unit configured to control an activation operation of the position correction signal generator.

7. The non-volatile memory device according to claim 3, wherein the global reference current unit includes a duplicate circuit configured to have substantially the same resistance value as those of the sense-amplifier and each circuit structure of the cell array.

8. The non-volatile memory device according to claim 7, wherein the global reference current unit includes:
    a line voltage unit configured to have a channel resistance value that is changed depending on the position of the selected memory cell;
    a resistor unit configured to have a fixed resistance value that is an intermediate value between data of a logic high level and data of a logic low level;
    a reference current output unit configured to output the global reference current and including a current mirror structure;
    a clamp voltage unit configured to be controlled by a voltage clamping control signal;
    a cell transistor unit configured to duplicate a transistor of a memory cell; and
    an activation unit configured to control an activation status of the global reference current unit.

9. The non-volatile memory device according to claim 8, wherein the clamp voltage unit and the sense-amplifier use the same power source and transistor.

10. The non-volatile memory device according to claim 8, wherein the cell transistor unit includes:
    a first transistor configured to receive a core voltage through a gate terminal; and
    a second transistor configured to receive a pumping voltage through a gate terminal.

11. The non-volatile memory device according to claim 1, wherein each memory cell includes a storage element having a different resistance value according to a value of information stored, and
    wherein the non-volatile memory device is a magneto resistive Random Access Memory.

12. The non-volatile memory device according to claim 11, wherein the storage element includes a Magnetic Tunneling Junction (MTJ) element in which data is written through variation in a direction of a magnetic field.

13. A non-volatile memory device comprising:
    a cell array including a plurality of unit cells each including a magneto-resistance element to store data, wherein a read or write operation, or both is performed on a selected unit cell using a change in resistance of a magneto-resistance element of the selected unit cell;
    a reference cell array including a plurality of reference cells each having a magneto-resistance element;
    a global reference current generation circuit configured to generate a global reference current that varies according to a position of a selected reference cell so as to verify data stored in the selected reference cell; and
    a sense-amplifier configured to compare a current flowing in the selected reference cell with the global reference current during a write verification operation of the selected reference cell, thereby sensing the data stored in the selected reference cell.

14. The non-volatile memory device according to claim 13, further comprising:
    a reference current generator configured to provide a reference current to the sense-amplifier during a read operation of the cell array, wherein the reference current is generated based on data stored in the reference cell array.

15. The non-volatile memory device according to claim 13, wherein the global reference current generation circuit includes:
   a line resistance correction unit configured to output a line voltage having a voltage level varying depending on the position of the selected reference cell; and
   a global reference current unit configured to output the global reference current in response to the line voltage.

16. The non-volatile memory device according to claim 15, wherein the line resistance correction unit is configured to control the voltage level of the line voltage differently according to each length of a bit line and a source line that are coupled to the selected reference cell.

17. The non-volatile memory device according to claim 15, wherein the line resistance correction unit includes:
   a cell position decision unit configured to output a plurality of position signals upon receiving a row address of the selected reference cell; and
   a position correction signal generator configured to output the line voltage having a different voltage level in response to the plurality of position signals.

18. The non-volatile memory device according to claim 17, wherein the position correction signal generator includes:
   a voltage divider in which a plurality of resistors are connected in series;
   a plurality of switches which are connected in parallel to the plurality of resistors and control the voltage level of the line voltage in response to the plurality of position signals; and
   an activation unit configured to control an activation operation of the position correction signal generator.

19. The non-volatile memory device according to claim 15, wherein the global reference current unit includes a duplicate circuit configured to have substantially the same resistance value as those of the sense-amplifier and each circuit structure of the reference cell array.

20. The non-volatile memory device according to claim 19, wherein the global reference current unit includes:
   a line voltage unit configured to have a channel resistance value that is changed depending on the position of the selected reference cell;
   a resistor unit configured to have a fixed resistance value that is an intermediate value between data of a logic high level and data of a logic low level;
   a reference current output unit configured to output the global reference current and including a current mirror structure;
   a clamp voltage unit configured to be controlled by a voltage clamping control signal;
   a cell transistor unit configured to duplicate a transistor of a reference cell; and
   an activation unit configured to control an activation status of the global reference current unit.

21. The non-volatile memory device according to claim 20, wherein the clamp voltage unit uses the same power source and transistor as those of the sense-amplifier.

22. The non-volatile memory device according to claim 20, wherein the cell transistor unit includes:
   a first transistor configured to receive a core voltage through a gate terminal; and
   a second transistor configured to receive a pumping voltage through a gate terminal.

23. The non-volatile memory device according to claim 22, wherein the magneto-resistance element includes a magnetic tunneling junction (MTJ) element in which data is written through variation in a direction of a magnetic field.

24. A nonvolatile memory control method, comprising:
   generating a line voltage varying depending on location of a selected unit cell by detecting the location of the selected unit cell based on a row address for accessing the selected unit cell;
   changing a level of a global reference current in response to the line voltage; and
   comparing the global reference current with a current flowing in the selected unit cell to sense data stored in the selected unit cell.

25. The nonvolatile memory control method according to claim 24, wherein the generating of the line voltage includes:
   generating a plurality of location signals with the row address of the selected unit cell; and
   generating the line voltage in response to the plurality of location signals.

26. The nonvolatile memory control method according to claim 24, wherein the changing of the level of the global reference current includes:
   adjusting a resistance value of a line voltage unit with the line voltage; and
   mirroring an output current of the line voltage unit to generate the global reference current.

* * * * *